US008815614B2

(12) United States Patent
Rodgers

(10) Patent No.: US 8,815,614 B2
(45) Date of Patent: Aug. 26, 2014

(54) METHOD FOR IMPROVING PROMPT DOSE RADIATION RESPONSE OF MIXED-SIGNAL INTEGRATED CIRCUITS

(75) Inventor: John C. Rodgers, Fairfax, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 295 days.

(21) Appl. No.: 13/483,124

(22) Filed: May 30, 2012

(65) Prior Publication Data

US 2012/0306050 A1    Dec. 6, 2012

Related U.S. Application Data

(60) Provisional application No. 61/491,956, filed on Jun. 1, 2011.

(51) Int. Cl.
| | |
|---|---|
| *H01L 21/00* | (2006.01) |
| *H04B 1/10* | (2006.01) |
| *H01L 23/556* | (2006.01) |
| *H01L 23/64* | (2006.01) |

(52) U.S. Cl.
CPC ..... *H01L 23/642* (2013.01); *H01L 2224/48227* (2013.01); *H01L 23/556* (2013.01); *H01L 2224/48091* (2013.01)
USPC ............................................. 438/10; 327/551

(58) Field of Classification Search
USPC ................ 326/33; 327/379, 382, 551; 438/10
See application file for complete search history.

(56) References Cited

U.S. PATENT DOCUMENTS

| | | | | | |
|---|---|---|---|---|---|
| 6,556,408 | B1 * | 4/2003 | Zhang | ............................ | 361/111 |
| 7,135,846 | B2 * | 11/2006 | Summer | ........................ | 323/284 |
| 7,635,970 | B2 * | 12/2009 | Summer | ........................ | 323/284 |
| 8,564,272 | B2 * | 10/2013 | Yen et al. | ........................ | 323/288 |
| 2006/0104095 | A1 * | 5/2006 | Summer | ........................ | 363/37 |
| 2009/0174385 | A1 * | 7/2009 | Yen et al. | ........................ | 323/288 |
| 2010/0014610 | A1 * | 1/2010 | Jaso | ............................... | 375/308 |

* cited by examiner

*Primary Examiner* — Evan Pert
(74) *Attorney, Agent, or Firm* — Daniel J. Long

(57) ABSTRACT

A system and method for improving the prompt dose radiation response of mixed-signal integrated circuits is disclosed. An internal analog circuit inside a mixed-signal integrated circuit generates an internal analog reference voltage that has been used for various purposes in the integrated circuit. At least one external capacitor is added either internal or external to a device package of the integrated circuit. The external capacitor reduces any change in the internal reference voltage due to prompt dose radiation by stabilizing the internal reference voltage and thus improves prompt dose radiation response of mixed-signal integrated circuits. A much greater value of capacitance may be provided without increase in dielectric rupture suceptability or decrease in manufacturing yield which may be associated with added on-chip capacitance. This increased capacitance primarily reduce the amount of disturbance caused to the internal node during a prompt dose radiation event.

4 Claims, 8 Drawing Sheets

METHOD FOR IMPROVING PROMPT DOSE RADIATION RESPONSE OF MIXED-SIGNAL INTEGRATED CIRCUITS

CROSS-REFERENCE TO RELATED APPLICATIONS

This Application claims rights under 35 USC §119(e) from U.S. Application Ser. No. 61/491,956 filed Jun. 1, 2011, the contents of which are incorporated herein by reference.

STATEMENT OF GOVERNMENT INTEREST

This invention was made with United States Government support under Contract No. NRO000-08-C-0358 awarded by the Naval Research Laboratory. The United States Government has certain rights in this invention.

TECHNICAL FIELD

Embodiments are generally related to semiconductor devices. Embodiments are also related to radiation hardening semiconductor devices. Embodiments are additionally related to an apparatus and method of hardening mixed signal Integrated Circuits (IC) having internally generated analog voltages. Embodiments are additionally related to an apparatus and method of improving the prompt dose radiation response of mixed-signal integrated circuits.

BACKGROUND OF THE INVENTION

Radiation hardening is a method of designing and testing electronic components and systems to make them resistant to damage or malfunctions caused by ionizing radiation (particle radiation and high-energy electromagnetic radiation), such as would be encountered in outer space, high-altitude flight, around nuclear reactors, particle accelerators, during nuclear accidents or nuclear warfare. For example, gamma rays are produced in fission and as a result of other neutron reactions and nuclear excitation of the weapon materials. These rays appear within a second or less after a nuclear explosion. The radiations from these sources are known either as prompt or instantaneous gamma rays. Such radiations cause damage or malfunctions to semiconductor devices.

An integrated circuit with both analog circuits and digital circuits on a single semiconductor die is known as a mixed-signal integrated circuit. In a prompt dose radiation environment mixed-signal integrated circuits are particularly susceptible to functional disruption due to signal level changes induced during the radiation pulse. Various radiation hardening techniques are in use today to harden the mixed-signal integrated circuit.

FIG. 1 illustrates one such common circuit hardening techniques. The radiation hardening apparatus 100 includes an external capacitor 110 added to a plurality of power supply pins 108 in a semiconductor device package 102. This avoids signal level changes in an integrated circuit 104 during prompt dose radiations. An internal analog circuit 106 generates an internal reference voltage that has been used for various purposes in the semiconductor integrated circuit 104. However the external capacitor 110 does not harden the changes in internal reference voltage during prompt dose radiations.

Internally generated analog reference voltages, however, are more difficult to harden because there is a practical limit to the amount of in-circuit capacitance that can be added to the chip without affecting die size. Also an increase in on-chip capacitance typically also decreases defect driven yield and increases susceptibility to heavy ion induced dielectric rupture.

A need, therefore, exists for an improved way to radiation harden circuits having internally generated analog voltages.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide semiconductor devices.

It is another aspect of the disclosed embodiments to provide radiation hardening semiconductor devices.

It is yet another aspect of the disclosed embodiments to provide for an improved apparatus and method of hardening a mixed signal integrated Circuit (IC) having internally generated analog voltages.

It is a further aspect of the present invention to provide for an improved apparatus and method of improving the prompt dose radiation response of the mixed-signal integrated circuit by adding at least one external capacitor within a device package.

It is another aspect of the present invention to provide for an improved apparatus and method of improving the prompt dose radiation response of the mixed-signal integrated circuit by adding at least one external capacitor external to the device package.

It is a yet another aspect of the present invention to stabilize a change in a reference voltage generated by an internal analog circuit during prompt dose radiation.

The aforementioned aspects and other objectives and advantages can now be achieved as described herein. A system and method for improving the prompt dose radiation response of mixed-signal integrated circuits is disclosed. An internal analog circuit in a mixed-signal integrated circuit generates an internal analog reference voltage, utilized for various purposes in the integrated circuit. At least one external capacitor is added either internal or external to a device package of the integrated circuit. The external capacitor reduces any change in the internal reference voltage due to prompt dose radiation by stabilizing the internal reference voltage. The stabilized reference voltage improves prompt dose radiation response of the mixed-signal integrated circuits.

A much greater value of external capacitance may be provided without increase in dielectric rupture suceptability or decrease in manufacturing yield which may be associated with added on-chip capacitance. This increased capacitance primarily reduces the amount of disturbance caused to the internal node during a prompt dose radiation event.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
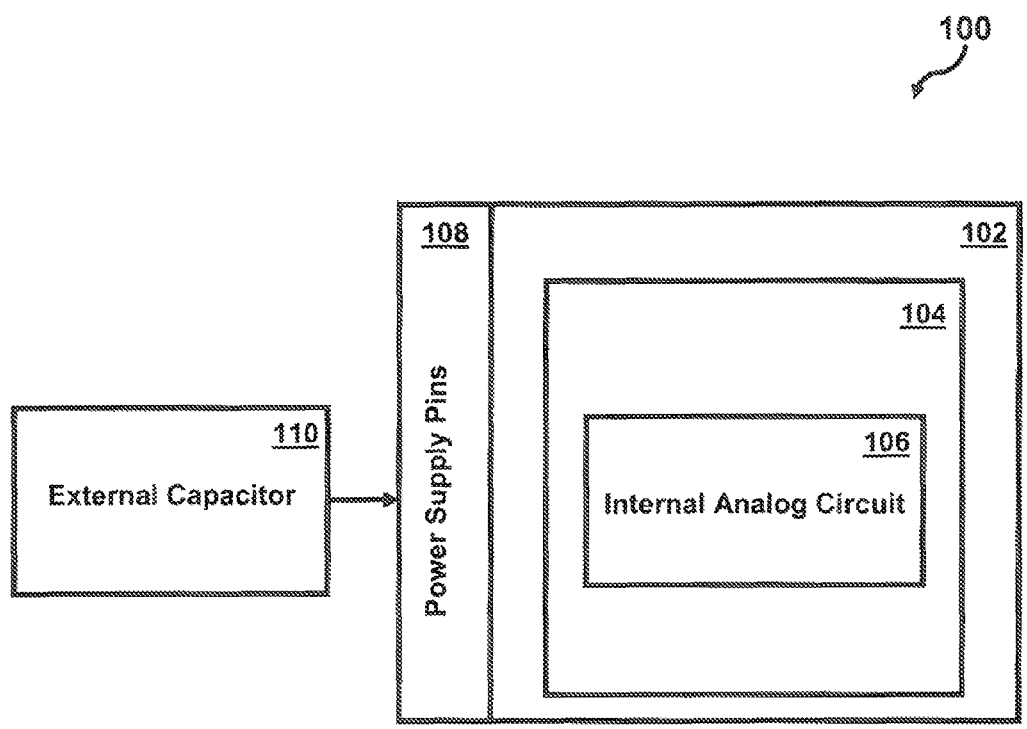
FIG. 1 illustrates a simplified block diagram of a conventional radiation hardening apparatus.
Figure 2:
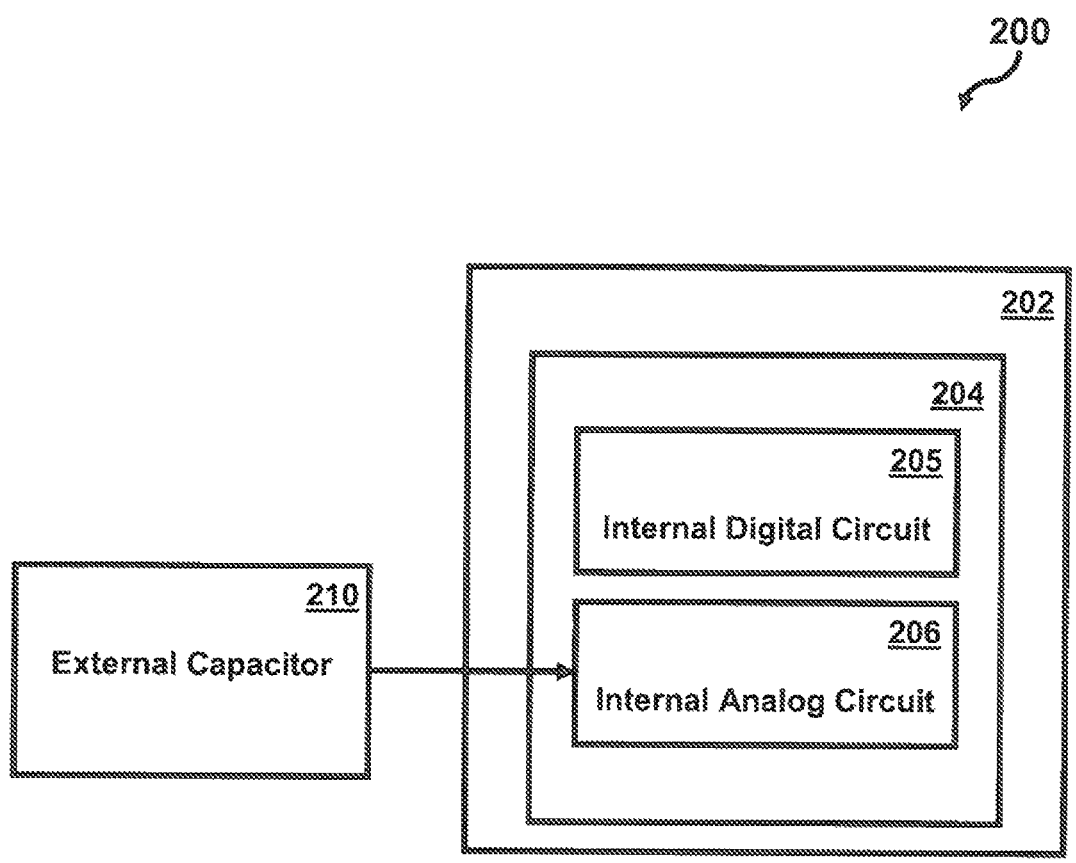
FIG. 2 illustrates a simplified block diagram of a radiation hardening apparatus utilized for improving the prompt dose radiation response of a mixed-signal integrated circuit by adding at least one external capacitor external to a device package, in accordance with the disclosed embodiments.

Referring to FIG. 2 a simplified block diagram of a radiation hardening apparatus 200 utilized for improving the prompt dose radiation response of a mixed-signal integrated circuit 204 is disclosed. The package 202 encloses the mixed signal Integrated Circuit (IC) 204. The IC 204 includes at least one internal analog circuit 206 and at least one internal digital circuit 205. The internal analog circuit 206 generates a reference voltage for use within the integrated circuit 204. At least one capacitor 210 is externally connected to the integrated circuit 204 and mounted external to the package 202. The internal reference voltage of internal analog circuit 206 is susceptible to upset in prompt dose radiation. The capacitor 210 stabilizes the changes in the internal reference voltage and hence improves the prompt dose radiation response of the IC 204.

Figure 3:
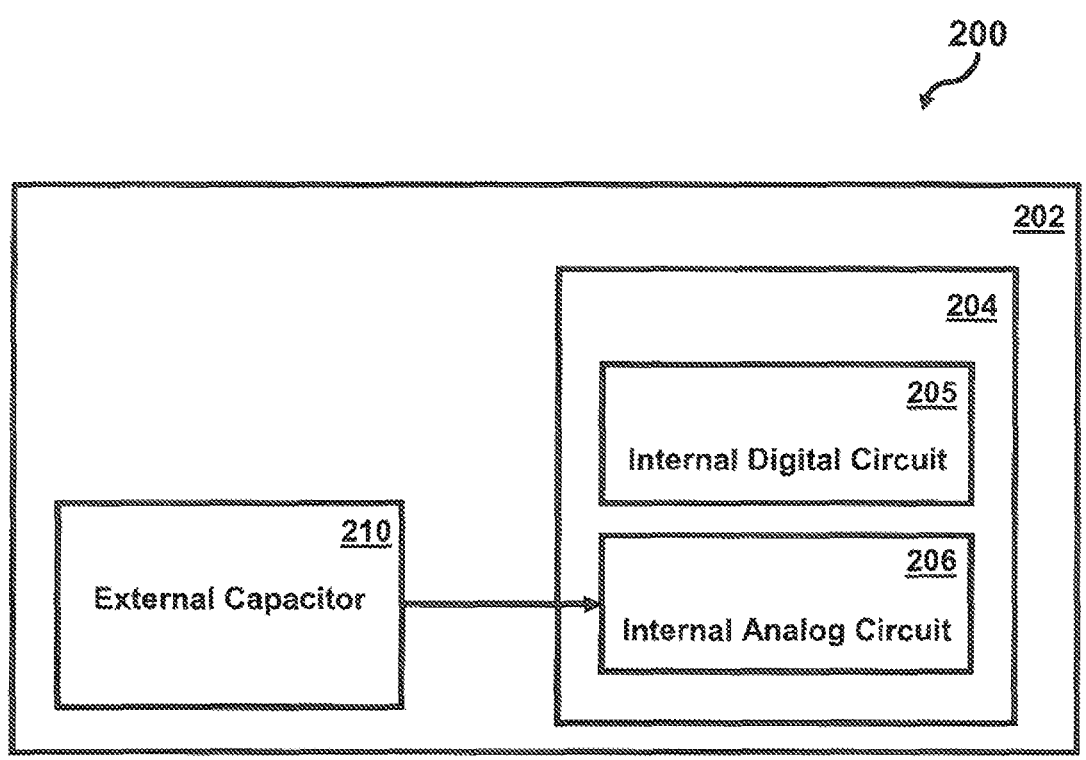
FIG. 3 illustrates a simplified block diagram of the radiation hardening apparatus utilized for improving the prompt dose radiation response of the mixed-signal integrated circuit by adding at least one external capacitor within the device package, in accordance with the disclosed embodiments.

FIG. 3 illustrates a simplified block diagram of the radiation hardening apparatus 200 utilized for improving the prompt dose radiation response of the mixed-signal integrated circuit 204, in accordance with the disclosed embodiments. The package 202 encloses the mixed signal integrated circuit 204 and at least one capacitor 210. The IC 204 includes at least one internal analog circuit 206 and at least one internal digital circuit 205. The internal analog circuit 206 generates a reference voltage for use within the integrated circuit 204. The capacitor 210 is externally connected to the integrated circuit 204 and mounted within the package 202. The internal reference voltage of internal analog circuit 206 is susceptible to upset in prompt dose radiation. The capacitor 210 stabilizes the changes in the internal reference voltage and hence improves the prompt dose radiation response of the IC 204.

Figure 4:
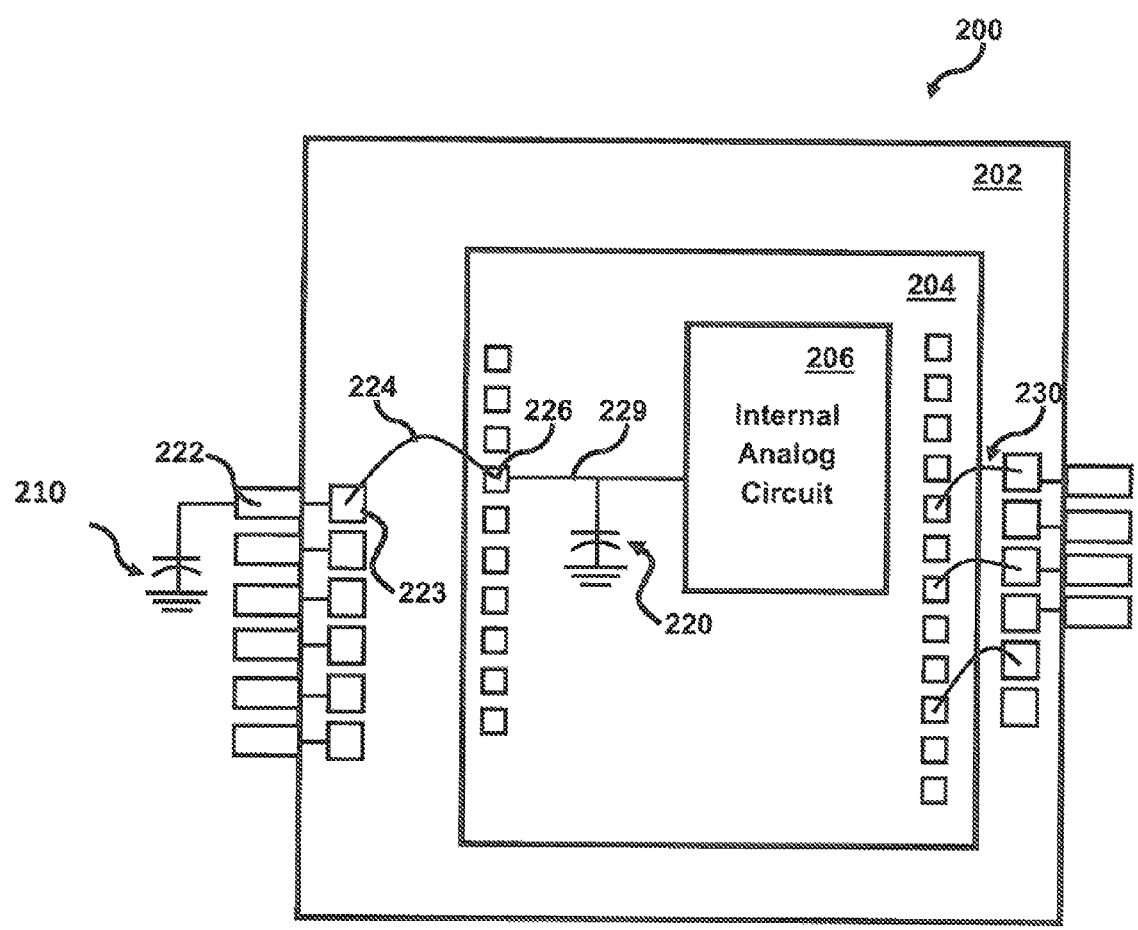
FIG. 4 illustrates a schematic diagram of the radiation hardening apparatus depicted in FIG. 2, in accordance with the disclosed embodiments.

Referring to FIG. 4 a schematic diagram of a radiation hardening apparatus 200 depicted in FIG. 2 is disclosed. The capacitor 210 is mounted external to the package 202 and connected to an external package connector 222. An internal package connection 224 is made from an internal package connector 223 to an internal IC connector 226. Then from the internal IC connector 226, a connection 229 to the internal analog circuit 206 is made. An internal on chip capacitor 220 limited in practical magnitude is also connected to the internal analog circuit 206 as shown. Also such capacitor 220 is susceptible to dielectric rupture due to heavy ion bombardment and decreases defect driven yield. Other internal package connections 230 are also shown in FIG. 4.

Figure 5:
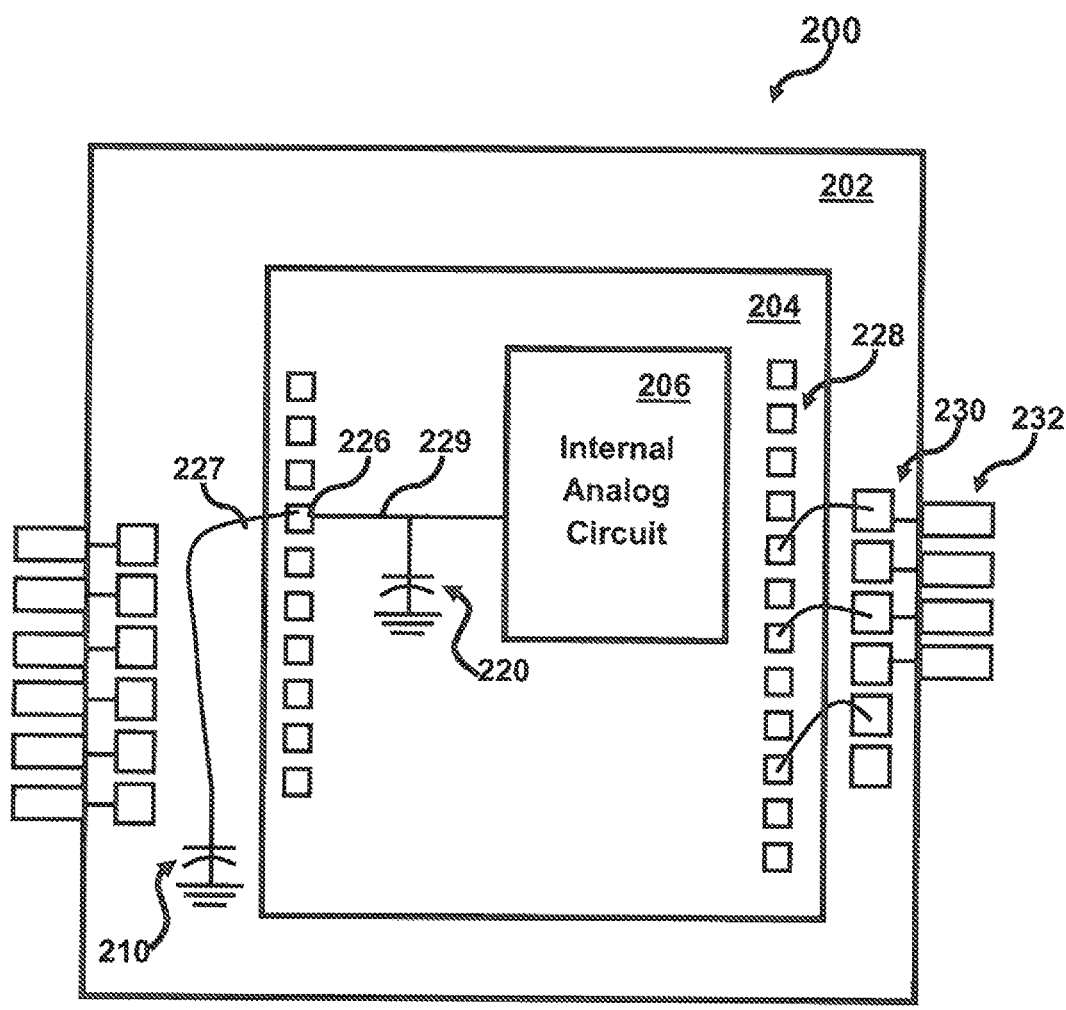
FIG. 5 illustrates a schematic diagram of the radiation hardening apparatus depicted in FIG. 3, in accordance with the disclosed embodiments.

FIG. 5 illustrates a schematic diagram of the radiation hardening apparatus 200 depicted in FIG. 3, in accordance with the disclosed embodiments. The capacitor 210 is directly connected to the internal IC connector 226 through an internal package connection 227. Then from the internal IC connector 226, a connection 229 to the internal analog circuit 206 is made. The capacitor 210 stabilizes the changes in the internal reference voltage and hence improves the prompt dose radiation response of the IC 204. An internal on chip capacitor 220 limited in practical magnitude is also connected to the internal circuit as depicted in FIG. 5. Also such capacitor 220 is susceptible to dielectric rupture due to heavy ion bombardment and decreases defect driven yield. Other internal package connections 230 are also shown in FIG. 5.

Figure 6:
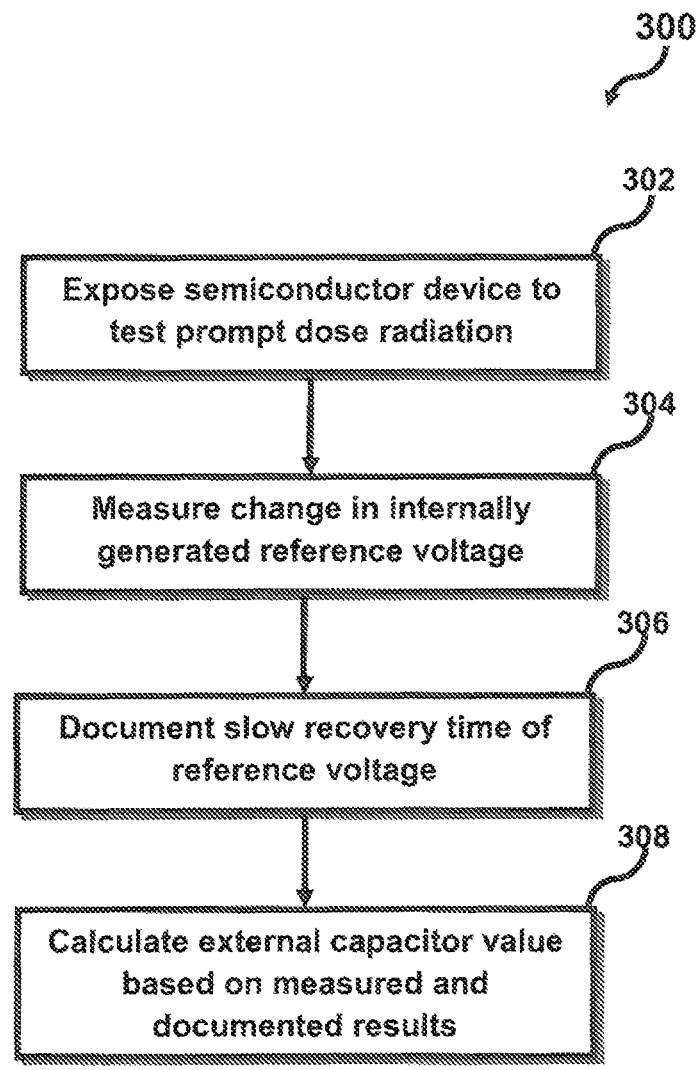
FIG. 6 illustrates a flow chart showing a method of testing the mixed-signal integrated circuit in prompt dose radiation response, in accordance with the disclosed embodiments.

Referring to FIG. 6 a flow chart 300 showing a method of testing the mixed-signal integrated circuit in prompt dose radiation response is disclosed. As said at block 302, the integrated circuit is exposed to test prompt dosage radiation. Then, the change in the reference voltage is measured on the integrated circuit during prompt dose testing as said at block 304 and as said at block 306, the slow recovery time of the reference voltage is documented. Finally, based on the change in reference voltage and recovery time, the external capacitor value is calculated as illustrated at block 308. Note that the calculated external capacitor can be connected external to the integrated circuit to stabilize the change in reference voltage.

Figure 7:
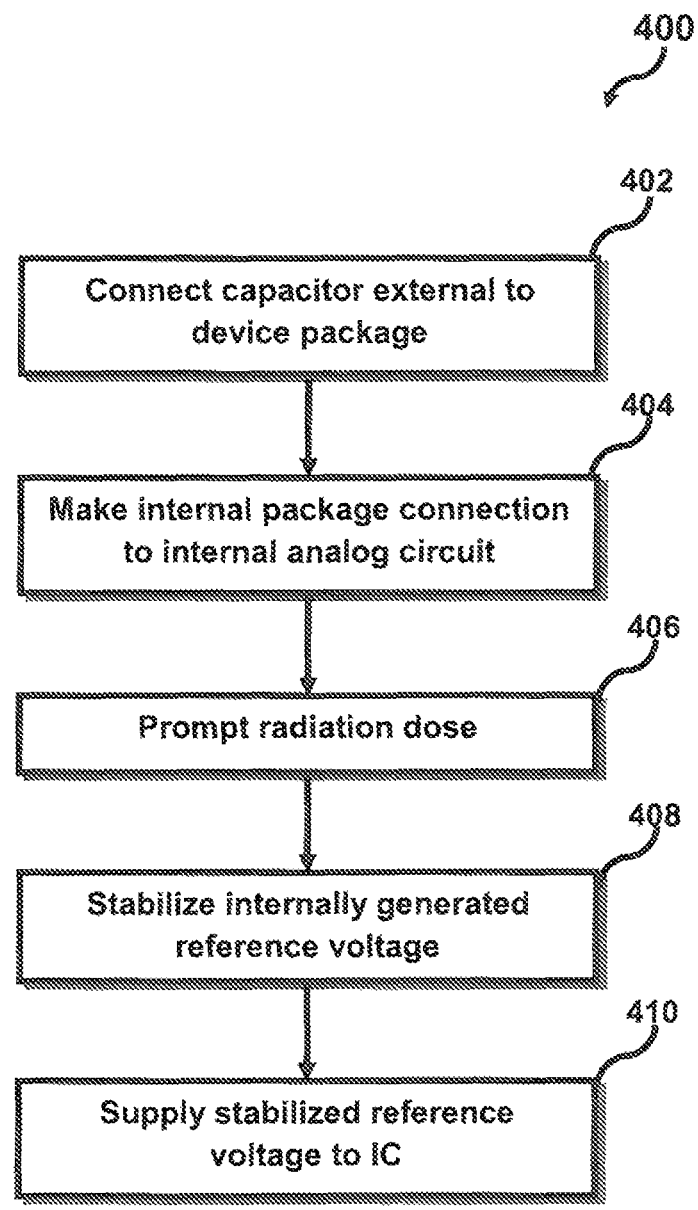
FIG. 7 illustrates a flow chart showing a method for improving the prompt dose radiation response of the mixed-signal integrated circuit by adding at least one external capacitor external to the device package, in accordance with the disclosed embodiments.

FIG. 7 illustrates a flow chart 400 showing a method for improving the prompt dose radiation response of the mixed-signal integrated circuit by adding at least one external capacitor external to the device package, in accordance with the disclosed embodiments. The external capacitor is connected to the device package as depicted at block 402. Then the internal package connection to the integrated circuit is made such that the external capacitor is connected to the internal analog circuit as said at block 404. As illustrated at block 406 the integrated circuit is exposed to the prompt dose radiation. The external capacitor stabilizes the change in the internally generated reference voltage and the stabilized reference voltage is supplied internally within the integrated circuit as said at block 408 and 410. This improves the prompt dose radiation response of the mixed-signal integrated circuit.

Figure 8:
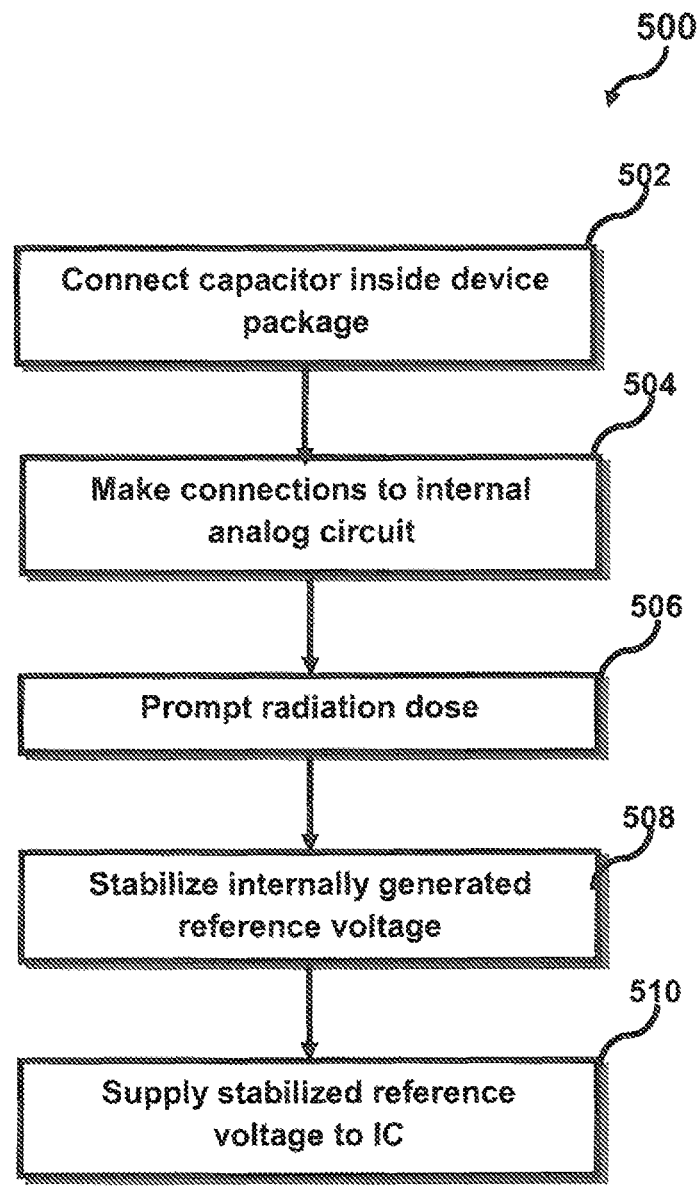
FIG. 8 illustrates a flow chart showing a method for improving the prompt dose radiation response of the mixed-signal integrated circuit by adding at least one external capacitor within the device package, in accordance with the disclosed embodiments.

FIG. 8 illustrates a flow chart 500 showing a method for improving the prompt dose radiation response of the mixed-signal integrated circuit by adding at least one external capacitor within the device package, in accordance with the disclosed embodiments. The external capacitor is connected within the device package as depicted at block 502. Then the internal integrated circuit connection to analog circuit is made such that the external capacitor is connected to the internal analog circuit as said at block 504. As illustrated at block 506 the integrated circuit is exposed to prompt dose radiation. The external capacitor stabilizes the change in the internally generated reference voltage and the stabilized reference voltage is supplied internally within the integrated circuit as said at block 508 and 510. This improves the prompt dose radiation response of the mixed-signal integrated circuit.

Note that a much greater value of the external capacitance may be provided without increase in the dielectric rupture suceptability or decrease in manufacturing yield which may be associated with added on-chip capacitance. This increased capacitance is meant primarily to reduce the amount of disturbance caused to the internal node during the prompt dose radiation event. The capacitance can be of a much higher value for example 1-10 µF and is not susceptible to dielectric rupture due to heavy ion bombardment and does not impact defect-driven yield.

The internal analog circuit can be a band gap reference circuit and other circuit designs can also be used for similar purpose without limitation. The external package connections can include pins, balls and columns without limitation. The internal package connections may include wire bond, C4 ball, solder bump without limitation. The device package may include interface wiring between integrated circuit and external package connection. The internal on chip capacitor is limited in practical magnitude, susceptible to dielectric rupture due to heavy ion bombardment and decreases defect driven yield.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for improving the prompt dose radiation response of a mixed-signal integrated circuit comprising:
    adding at least one external capacitor to a mixed-signal integrated circuit;
    positioning said capacitor internal or external to the device package;
    making connections such that said external capacitor is connected to an internal analog circuit of said mixed-signal integrated circuit;
    exposing said mixed-signal integrated circuit to prompt dose radiation;
    stabilizing an internal reference voltage generated by said internal analog circuit; and
    supplying said internal reference voltage to said mixed-signal integrated circuit.

2. The method of claim 1 wherein a greater value of said external capacitor is added without increase in dielectric rupture susceptibility or decrease in manufacturing yield which may be associated with added on-chip capacitance.

3. The method of claim 1 wherein said external capacitor is meant primarily to reduce an amount of disturbance caused to said internal analog circuit during a prompt dose radiation event.

4. A method for improving the prompt dose radiation response of a mixed-signal integrated circuit comprising:
    adding at least one external capacitor to a mixed-signal integrated circuit;
    positioning said capacitor internal or external to the device package;
    making connections such that said external capacitor is connected to an internal analog circuit of said mixed-signal integrated circuit;
    exposing said mixed-signal integrated circuit to prompt dose radiation;
    stabilizing an internal reference voltage generated by said internal analog circuit; and
    supplying said internal reference voltage to said mixed-signal integrated circuit, wherein a greater value of said external capacitor is added without increase in dielectric rupture susceptibility or decrease in manufacturing yield which may be associated with added on-chip capacitance and meant primarily to reduce an amount of disturbance caused to said internal analog circuit during a prompt dose radiation event.

* * * * *